(12) United States Patent
Zang et al.

(10) Patent No.: US 10,580,685 B2
(45) Date of Patent: Mar. 3, 2020

(54) INTEGRATED SINGLE DIFFUSION BREAK

(71) Applicant: GLOBALFOUNDRIES INC., Grand Cayman (KY)

(72) Inventors: Hui Zang, Guilderland, NY (US); Haiting Wang, Clifton Park, NY (US); Hong Yu, Rexford, NY (US); Laertis Economikos, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/047,078

(22) Filed: Jul. 27, 2018

(65) Prior Publication Data

US 2020/0035543 A1    Jan. 30, 2020

(51) Int. Cl.
| | |
|---|---|
| *H01L 23/522* | (2006.01) |
| *H01L 21/762* | (2006.01) |
| *H01L 29/66* | (2006.01) |
| *H01L 21/8234* | (2006.01) |
| *H01L 29/78* | (2006.01) |
| *H01L 21/764* | (2006.01) |

(52) U.S. Cl.
CPC ............ *H01L 21/76229* (2013.01); *H01L 21/823431* (2013.01); *H01L 21/823481* (2013.01); *H01L 29/66795* (2013.01); *H01L 29/785* (2013.01); *H01L 21/764* (2013.01)

(58) Field of Classification Search
CPC ....... H01L 21/76229; H01L 21/823431; H01L 21/823481; H01L 21/764; H01L 21/04; H01L 29/66795; H01L 29/785
See application file for complete search history.

(56) References Cited

U.S. PATENT DOCUMENTS

| 8,846,491 B1* | 9/2014 | Pham ................ H01L 21/76224 257/E21.409 |
|---|---|---|
| 2014/0117454 A1 | 5/2014 | Liu et al. |
| 2019/0109045 A1* | 4/2019 | Xie .................... H01L 21/76897 |
| 2019/0148373 A1* | 5/2019 | Shi .................... H01L 21/31144 257/401 |

* cited by examiner

*Primary Examiner* — Yosef Gebreyesus
(74) *Attorney, Agent, or Firm* — Francois Pagette Hoffman Warnick LLC

(57) ABSTRACT

A methodology for forming a fin field effect transistor (FinFET) includes the co-integration of various isolation structures, including gate cut and shallow diffusion break isolation structures that are formed with common masking and etching steps. Following an additional patterning step to provide segmentation for source/drain conductive contacts, a single deposition step is used to form an isolation dielectric layer within each of gate cut openings, shallow diffusion break openings and cavities over shallow trench isolation between device active areas.

9 Claims, 14 Drawing Sheets

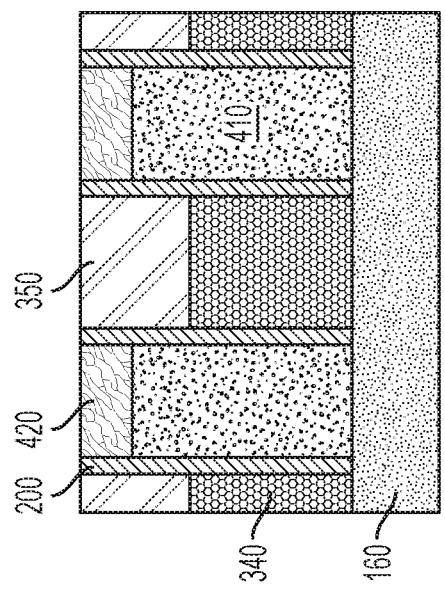
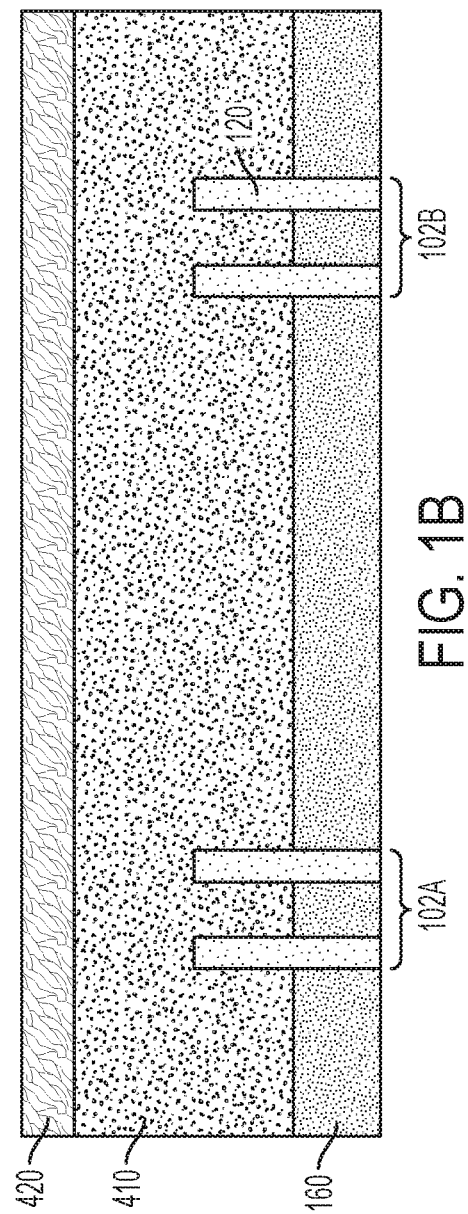

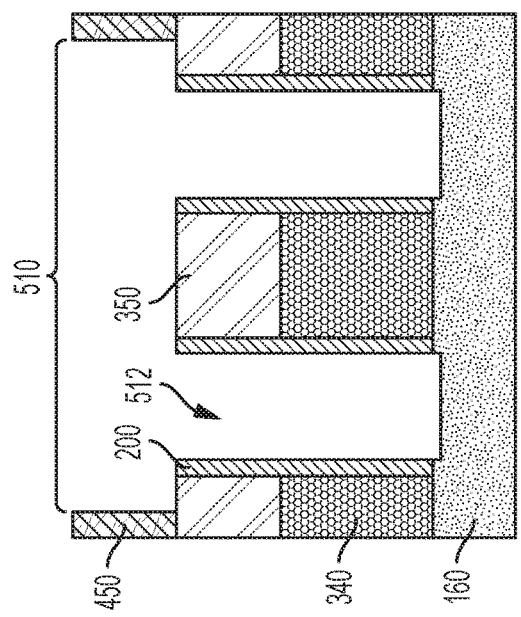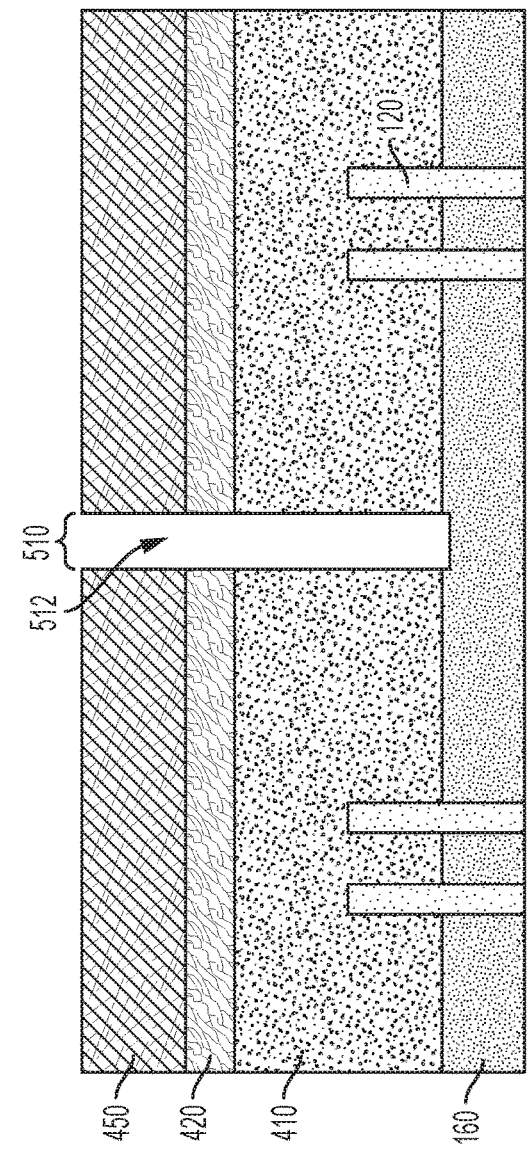

INTEGRATED SINGLE DIFFUSION BREAK

BACKGROUND

The present disclosure relates generally to semiconductor devices, and more particularly to fin field effect transistors (FinFETs) and their methods of fabrication.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

A trend in the development of semiconductor manufacturing technologies has been to increase the density of devices per chip, and hence decrease the size of active structures as well as the distances between such structures. An increase in device density may advantageously affect device performance such as circuit speed, and may allow also for increasingly complex designs and functionality. However, the decrease in size and the attendant increase in density may also generate undesirable effects, including unwanted short circuits between adjacent conductive elements.

In various approaches to scaling FinFETs to increasingly greater device densities, an individual fin may be cut or severed to define distinct regions among remaining portions of the fin that may be used to form independent devices. Such a process typically involves etching unwanted portions of a fin to form a cut region, and backfilling the cut region with a dielectric material to isolate the remaining active regions of the fin on either side of the cut region. The resulting isolation structure may be referred to as a single diffusion break, where a lateral width in the current direction or gate length direction of the dielectric material between the two active regions is less than or equal to the lateral width of a single gate structure overlying the fin.

In a similar vein, in conjunction with a replacement metal gate (RMG) or "gate last" process for fabricating FinFET devices, prior to depositing the gate dielectric and gate conductor layers, a sacrificial gate may be cut to form an opening that is backfilled with an etch selective isolation dielectric layer. Typically, the gate cut is located within an isolation region of the substrate, i.e., over shallow trench isolation, adjacent to one or more active device regions. In an example RMG process, remaining portions of the sacrificial gate are then removed selectively with respect to the backfilled isolation dielectric layer and the resulting cavities filled with a functional gate architecture that is separated from adjacent devices by the isolation dielectric.

In both the single diffusion break and gate cut architectures, a backfilled dielectric layer prevents unwanted current flow between neighboring active regions. As will be appreciated, however, the formation of these and other isolation structures, particularly at advanced nodes, may pose design and processing challenges.

SUMMARY

Accordingly, it would be advantageous to provide methods for forming fin cut and single diffusion break structures that are compatible with additional processes, such as the partitioning of gate and/or source/drain metallization structures amongst respective devices. In accordance with various embodiments, in conjunction with a replacement metal gate process flow, a single etch mask and a corresponding etch step are used to form a gate cut opening within a sacrificial gate over an isolation (inactive) region of a substrate, and a single diffusion break cavity within an active region of the substrate. The co-integration of the gate cut and SDB architectures advantageously decreases the number of masking and etch steps. An isolation dielectric layer can be formed within the gate cut opening and the SDB opening, as well as within trenches that are adapted to separate later-formed source/drain contact structures.

An example semiconductor device includes a plurality of semiconductor fins disposed over a semiconductor substrate, where the semiconductor fins each have a source/drain region and a channel region adjacent to the source/drain region, a shallow trench isolation layer disposed over a top surface of the semiconductor substrate and peripheral to lower portions of the fins, and a gate stack disposed over the channel regions, where the gate stack includes a gate dielectric layer, a work function metal layer overlying the gate dielectric layer, and a conductive fill layer overlying the work function metal layer.

The device further includes a gate cap disposed over the gate stack, and an isolation dielectric layer extending through the gate stack such that the isolation dielectric layer is disposed directly over sidewalls of the conductive fill layer.

According to further embodiments, a semiconductor device includes a gate stack disposed over a channel region of a semiconductor layer, and an isolation dielectric layer extending through the gate stack, wherein the isolation dielectric layer is disposed directly over sidewalls of the conductive fill layer.

An exemplary method of forming a semiconductor device includes forming a plurality of semiconductor fins over a semiconductor substrate, the semiconductor fins each having a source/drain region and a channel region adjacent to the source/drain region, forming a shallow trench isolation layer over a top surface of the semiconductor substrate and peripheral to lower portions of the fins, and forming a gate stack over the channel regions, wherein the gate stack comprises a gate dielectric layer, a work function metal layer overlying the gate dielectric layer, and a conductive fill layer overlying the work function metal layer.

The method further includes forming a gate cut opening by etching a first trench into the gate stack within a first region of the substrate, wherein the shallow trench isolation layer is exposed at a bottom of the first trench, and forming a fin cut opening by etching a second trench into the gate stack and partially through at least one fin within a second region of the substrate, wherein the gate cut opening and the fin cut opening are formed simultaneously.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 1A is a cross-sectional view along line A of FIG. 1 through a gate cut region of the device architecture over shallow trench isolation (STI) between neighboring active regions;

FIG. 1B shows a cross-sectional view along line B of FIG. 1 orthogonal to the view of FIG. 1A and through a gate traversing a shallow trench isolation between first and second active regions;

FIG. 2A shows the selective removal of the gate from within the gate cut region between the first and second active regions to form a gate cut opening;

FIG. 2B shows selective removal of the gate from within the gate cut region;

DETAILED DESCRIPTION

Figure 1:
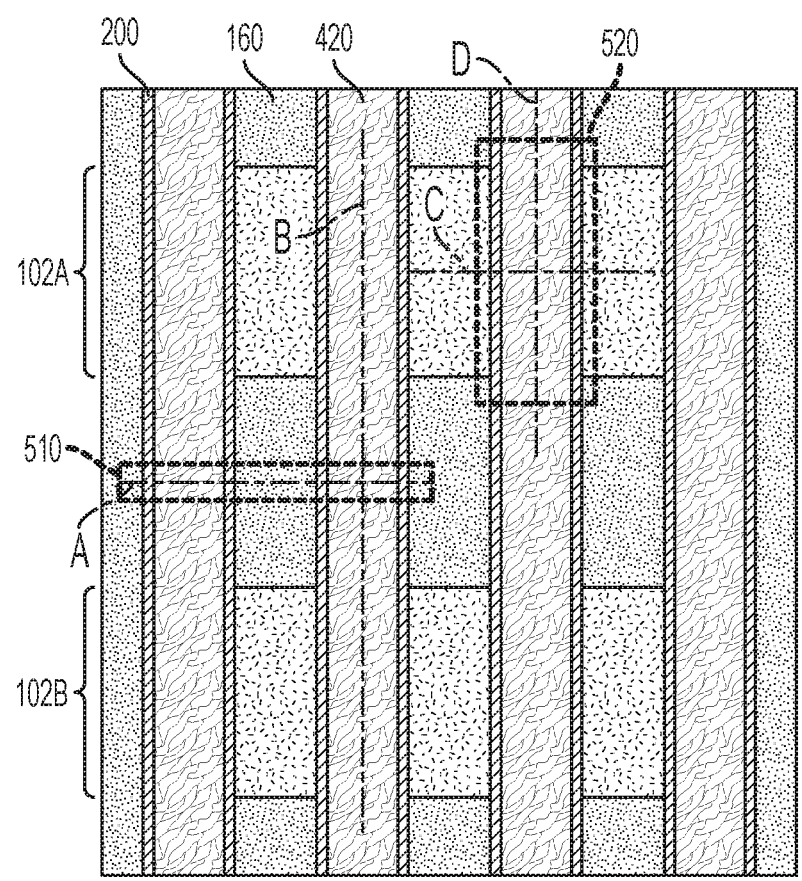
FIG. 1 is a schematic layout of a FinFET device architecture showing gate cut and single diffusion break (SDB) regions following a replacement metal gate module.

Reference will now be made in greater detail to various embodiments of the subject matter of the present application, some embodiments of which are illustrated in the accompanying drawings. The same reference numerals will be used throughout the drawings to refer to the same or similar parts.

As will be appreciated, the various components and layers of the structures disclosed herein may be formed using a variety of different materials and methods, such as a chemical vapor deposition (CVD), atom layer deposition (ALD), thermal oxidation, spin-coating etc The compositions and thicknesses of these various layers of material may vary depending upon die particular application or function.

The manufacture of fin field effect transistors (FinFETs) typically leverages a self-aligned process to produce extremely thin semiconductor fins, e.g., 20 nm wide or less, on the surface of a substrate using selective-etching techniques. Source/drain regions are formed over the fins adjacent to channel regions, and a gate structure including a gate dielectric and a gate conductor is deposited to contact multiple surfaces of each fin within the channel regions to form a multi-gate architecture. Interlayer dielectric and metallization layers are then deposited to provide electrical contacts. Further to the foregoing, a method of forming a FinFET where various isolation structures are co-integrated into the manufacturing process flow is described herein with reference to FIGS. 1-6.

Referring to FIG. 1, a partially cut-away top-down plan view layout of a FinFET architecture at an intermediate stage of fabrication includes first and second active areas 102A, 102B of a semiconductor substrate (not shown) separated by shallow trench isolation 160. According to various embodiments, as shown in the cross-sectional views of FIGS. 1A, 1B, 1C and 1D, which are taken along lines A, B, C and D respectively of FIG. 1, a first plurality of fins 120 are disposed within the first active area 102A of the substrate, and a second plurality of fins 120 are disposed within the second active area 102B of the substrate. Fins 120 are omitted from FIG. 1 for clarity. Furthermore, although two pairs of fins 120 are shown in the illustrated cross-sections, it will be appreciated that an array of multiple fins may be formed over the semiconductor substrate 100 within each active area 102A, 102B.

Within active areas 102A, 102B, a variety of different devices may be manufactured, including logic devices and memory devices. The various devices may be PMOS or NMOS devices, for example. For instance, a p-type device may be formed within the first active area 102A and an n-type device may be formed within the second active area 102B.

The devices are formed over a semiconductor substrate. The semiconductor substrate 100 may be a bulk substrate or a composite substrate such as a semiconductor-on-insulator (SOI) substrate, and may include any suitable semiconductor material as known to those skilled in the art. Portions of the semiconductor substrate may be amorphous, polycrystalline, or single crystalline. In the illustrated embodiment, semiconductor substrate 100 may be a bulk silicon substrate. In alternate embodiments, the semiconductor substrate 100 may be an SOI substrate that includes, from bottom to top, a handle portion, an isolation layer, and a semiconductor material layer. In the illustrated embodiment, only the topmost semiconductor material layer of such a substrate is shown.

In various embodiments, each fin 120 includes a semiconductor material such as silicon, and may be formed by patterning and then etching the semiconductor substrate 100, e.g., a top portion of the semiconductor substrate. In several embodiments, the fins 120 are etched from, and are therefore contiguous with the semiconductor substrate 100. For instance, fins 120 may be formed using a sidewall image transfer (SIT) process as known to those skilled in the art.

Each fin 120 can include a single crystal semiconductor material that extends along a lengthwise direction. As used herein, a "lengthwise direction" is a horizontal direction along which an object extends the most. A "widthwise direction" is a horizontal direction that is perpendicular to the lengthwise direction. Furthermore, "horizontal" refers to a general direction along a primary surface of a substrate, and "vertical" is a direction generally orthogonal thereto. "Vertical" and "horizontal" are generally perpendicular directions relative to one another independent of orientation of the substrate in three-dimensional space.

In certain embodiments, the fins 120 can have a width of 5 nm to 20 nm, and a height of 40 nm to 150 nm, although other dimensions are contemplated. In structures including plural fins, i.e., a fin array, each fin 120 may be spaced apart from its nearest neighbor by a periodicity or pitch (d) of 20 nm to 100 nm, e.g., 20, 30, 40, 50, 60, 70, 80, 90 or 100 nm, including ranges between any of the foregoing values. As used herein, the term "pitch" refers to the sum of the fin width and the spacing between neighboring fins.

Plural fins are typically oriented parallel to each other and perpendicular to the library logic flow of a circuit. As described further herein, following fin formation, a fin cut or fin removal process may be used to eliminate unwanted fins or unwanted portions thereof for the particular circuit or device being fabricated. Thus, the fin-to-fin periodicity may be constant or variable over an array of fins.

As will be appreciated by those skilled in the art, the semiconductor fins 120 are typically isolated from each other by shallow trench isolation layer 160. Shallow trench isolation (STI) layer 160 may be used to provide electrical isolation between the fins 120 and between adjacent devices as is needed for the circuit(s) being implemented. An STI process for FinFET devices involves creating isolation trenches in the semiconductor substrate 100 through an anisotropic etch process. The isolation trench between each adjacent fin may have a relatively high aspect ratio (e.g., ratio of the depth of the isolation trench to its width). A dielectric fill material, such as silicon dioxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure.

"Planarization" and "planarize" as used herein refer to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Figure 1C:
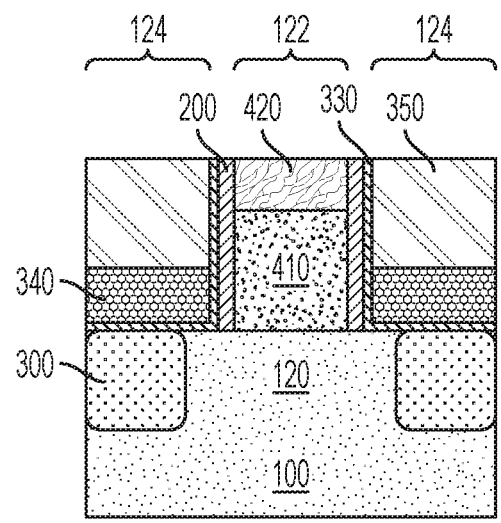
FIG. 1C is a cross-sectional view along line C of FIG. 1 through a fin within the first active region.
Figure 1D:
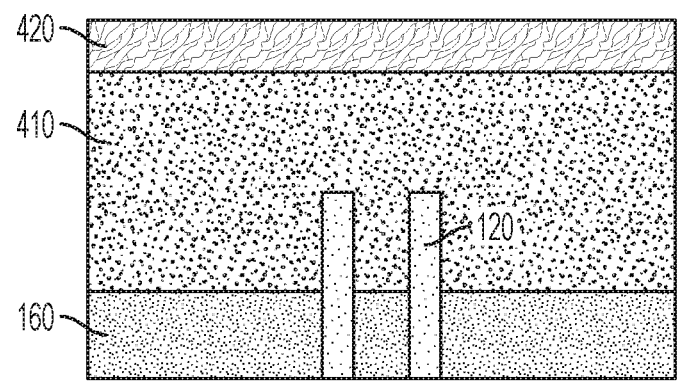
FIG. 1D shows a cross-sectional view along line D of FIG. 1 within the single diffusion break region and through the gate.

In certain embodiments, as shown for example in FIGS. 1B and 1D, the planarized STI oxide is etched back to form a recessed, uniformly thick oxide isolation layer 160 over a top surface of the substrate between the fins 120, where upper sidewalls of the fins 120 can be exposed for further processing.

As illustrated in FIG. 1C, fins 120 include alternating channel regions 122 and source/drain regions 124 as understood by one skilled in the art. Referring again to FIG. 1, illustrated is a replacement metal gate (RMG) structure following the removal of a sacrificial gate, showing spacer layers 200 that are formed over sidewalls of the sacrificial gate and, as showed in FIG. 1C, source/drain junctions 300 disposed over source/drain regions 124 of a fin 120. A liner 330, sacrificial layer of amorphous silicon 340, and an interlayer dielectric 350 are disposed over the source/drain junctions 300 between adjacent spacer layers 200. Following removal of the sacrificial gate, gate dielectric and work function metal layers (collectively 410) are deposited in succession, i.e., between adjacent spacer layers 200 over the channel regions 122 of the fin 120. A self-aligned gate cap 420 may be formed over each gate 410.

Spacer layers 200 may be formed by blanket deposition of a spacer material (e.g., using atomic layer deposition) followed by a directional etch such as reactive ion etching (RIE) to remove the spacer material from horizontal surfaces. In certain embodiments, the spacer layer 200 thickness is 4 to 20 nm, e.g., 4, 10, 15 or 20 nm, including ranges between any of the foregoing values.

Suitable materials for the spacer layers 200 include oxides, nitrides and oxynitrides, such as silicon dioxide, silicon nitride, silicon oxynitride, and low dielectric constant (low-k) materials. As used herein, a low-k material has a dielectric constant less than that of silicon nitride.

Exemplary low-k materials include but are not limited to, amorphous carbon, SiOC, SiOCN, SiBCN, fluorine-doped oxides, or carbon-doped oxides. Commercially-available low-k dielectric products and materials include Dow Corning's SiLK™ and porous SiLK™, Applied Materials' Black Diamond™, Texas Instrument's Coral™ and TSMC's Black Diamond™ and Coral™.

As will be appreciated, the compounds silicon dioxide and silicon nitride have compositions that are nominally represented as $SiO_2$ and $Si_3N_4$, respectively. The terms silicon dioxide and silicon nitride refer to not only these stoichiometric compositions, but also to oxide and nitride compositions that deviate from the stoichiometric compositions.

Source/drain junctions 300 may be formed by ion implantation or selective epitaxy following formation of the sacrificial gate and spacer layers 200, optionally using the sacrificial gates and spacer layers 200 as an alignment mask.

According to various embodiments, source/drain junctions 300 are formed by selective epitaxy into self-aligned cavities that are defined between the sacrificial gates. Source/drain junctions 300 may include silicon (e.g., Si) or a silicon-containing material such as silicon germanium (SiGe). For instance, SiGe source/drain junctions may be incorporated into a PMOS device to provide compressive stress to the channel, which can improve carrier mobility.

The selective epitaxy process deposits an epitaxial layer directly onto the exposed surfaces of the fins 120 adjacent to the spacer layers 200. Exposed surfaces of the fins 120 may include the top surface as well as upper portions of the sidewalls of the fins proximate to the top surface. In various embodiments, a silicon epitaxial layer is formed without deposition of silicon on the exposed dielectric surfaces. Selective epitaxial layers may be formed using molecular beam epitaxy or chemical vapor deposition processes that are adapted for selective epitaxy.

An example silicon epitaxial process for forming source/drain junctions 300 uses a gas mixture including $H_2$ and dichlorosilane ($SiH_2Cl_2$) at a deposition (e.g., substrate) temperature of 600-800° C. Other suitable gas sources for silicon epitaxy include silicon tetrachloride ($SiCl_4$), silane ($SiH_4$), trichlorosilane ($SiHCl_3$), and other hydrogen-reduced chlorosilanes ($SiH_xCl_{4-x}$).

As used herein, the terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Example epitaxial growth processes include low energy plasma deposition, liquid phase epitaxy, molecular beam epitaxy, and atmospheric pressure chemical vapor deposition.

The source/drain junctions 300 and corresponding (i.e., underlying) source/drain regions 124 of the fins 120 may be doped, which may be performed in situ, i.e., during epitaxial growth, or following epitaxial growth, for example, using ion implantation. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. In a silicon-containing fin, example p-type dopants, i.e., impurities, include but are not limited to boron, aluminum, gallium, and indium. As used herein, "n-type" refers to the addition of impurities that contribute free electrons to an intrinsic semiconductor. In a silicon-containing fin, example n-type dopants, i.e., impurities, include but are not limited to, antimony, arsenic, and phosphorus.

In certain embodiments, the formation of source/drain junctions 300 precedes a replacement metal gate module, where the sacrificial gate is removed and replaced with a functional gate. A "functional gate" includes a gate dielectric and a gate conductor, and is operable to switch a semiconductor device from an "on" state to "off" state, and vice versa.

After formation of the source/drain junctions 300, the conformal liner 330, sacrificial amorphous silicon layer 340, and interlayer dielectric 350 are successively formed within contact locations over the source/drain junctions 300 between neighboring spacer layers 200, as well as over STI 160 between active areas. The conformal liner 330 is disposed over sidewalls of the spacer layers 200 as well as over a top surface of the source/drain junctions 300. The conformal liner is adapted to function as a contact etch stop layer (CESL).

Conformal liner 330 may be formed by blanket deposition of a suitable contact etch stop material (e.g., using atomic layer deposition). In certain embodiments, the conformal liner thickness is 2 to 10 nm, e.g., 2, 4, 6, 8 or 10 nm, including ranges between any of the foregoing values.

Suitable materials for the conformal liner 330 include oxides, nitrides and oxynitrides, such as silicon dioxide, silicon nitride, silicon oxynitride, and low dielectric constant (low-k) materials such as amorphous carbon, SiOC, SiOCN and SiBCN.

In various embodiments, the spacer layer 200 and the conformal liner 330 are formed from materials that can be etched selectively to one another. In particular embodiments, the spacer layers 200 include SiOCN and the conformal liner 330 (i.e., contact etch stop layer) includes silicon nitride.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

Sacrificial amorphous silicon layer 340 partially fills the cavities over source/drain regions 124. By way of example, amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition.

In certain embodiments, the sacrificial amorphous silicon layer 340 is formed over source/drain regions 124 and over gate 410, i.e., directly over the conformal liner 330 and the gate cap 420, and is then etched back to expose the gate cap 420 such that a top surface of the sacrificial amorphous silicon layer 340 within the source/drain regions 124 is below a top surface of the neighboring gate 410.

Interlayer dielectric 350 is disposed between adjacent sacrificial gates, i.e., directly over the sacrificial amorphous silicon layer 340. The interlayer dielectric 350 may include any dielectric material including, for example, oxides, nitrides or oxynitrides. In one embodiment, the interlayer dielectric 350 includes silicon dioxide. In various embodiments, the interlayer dielectric may be self-planarizing, or the top surface of the interlayer dielectric 350 can be planarized by chemical mechanical polishing (CMP) using the sacrificial gate 420 as a polish stop.

Referring still to FIG. 1 and FIGS. 1A-1D, a replacement metal gate (RMG) module includes removal of the sacrificial gate and the subsequent formation of a functional gate 410 over the top and sidewall surfaces of the channel regions 122 of fins 120. The gate 410 includes a conformal gate dielectric layer formed directly over the exposed top and sidewall surfaces of the fins 120, a work function metal layer formed over the gate dielectric, and a conductive fill layer formed over the work function metal layer. For clarity, the individual gate layers are not separately shown.

The gate dielectric may include silicon dioxide, silicon nitride, silicon oxynitride, a high-k dielectric, or other suitable material. As used herein, a high-k material has a dielectric constant greater than that of silicon nitride. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2. The gate dielectric thickness may range from 1 nm to 10 nm, e.g., 1, 2, 4, 6, 8 or 10 nm, including ranges between any of the foregoing. In various embodiments, the gate dielectric includes a thin layer (e.g., 0.5 nm) of silicon dioxide and an overlying layer of high-k dielectric material.

The gate conductor layer is formed over the gate dielectric layer. The gate conductor layer may include a conductive material such as polysilicon, silicon-germanium, a conductive metal such as Al, W, Cu, Ti, Ta, W, Pt, Ag, Au, Ru, Jr, Rh and Re, alloys of conductive metals, e.g., Al—Cu, silicides of one or more conductive metals, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor 430 may include one or more layers of such materials such as, for example, a metal stack including a barrier layer, work function metal layer, and conductive fill layer.

The gate conductor layer may include a conformal layer work function metal layer that is formed directly over the gate dielectric. The gate conductor can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition.

Following a recess etch of the gate stack, a self-aligned gate cap 420 can be formed directly over the gate 410. Following deposition of the gate cap material, a polishing step may be used to remove the overburden and form a planarized structure. By way of example, the gate cap 420 may include a nitride material such as silicon nitride or silicon oxynitride (SiON).

As shown in FIG. 1, a gate cut region 510 is located outside of active areas 102A, 102B, i.e., over STI 160, and represents the region where selected portions of gate 410 will be cut and replaced with an etch selective material in order to isolate adjacent functional gates. Shown also in FIG. 1 is a fin cut region 520, where selected fins will be cut within first active area 102A to form a single diffusion break according to exemplary embodiments. Formation of the SDB also includes etching of the gate 410 overlying the fins. In example processes, the formation of a gate cut, e.g., by etching the gate 410 to form a gate cut opening and back-filling the gate cut opening with an isolation dielectric, and the formation of a single diffusion break, e.g., by etching the gate 410 and the underlying fins 120 within first active area 102A to form a fin cut opening, and back-filling the fin cut opening with an isolation dielectric, occur simultaneously. That is, a single mask, a single etch step, and single deposition step are used to form both the gate cut and the SDB.

In FIG. 1, reference line A is taken through gate cut region 510 of the architecture between active areas 102A, 102B, i.e., over shallow trench isolation 160. Reference line B is taken along gate 410 and traverses the first active area 102A, the isolation region 160 including gate cut region 510, and the second active area 102B. Reference line C is taken along fin 120 within the first active area 102A and crosses fin cut region 520, while reference line D is taken along a gate within the first active area 102A, and through the fin cut region 520. With respect to the schematic layout of FIG. 1, FIGS. 1A-6A depict cross-sectional views along line A, FIGS. 1B-6B are cross-sectional views along line B, FIGS. 1C-6C are cross-sectional views along line C, and FIGS. 1D-6D are cross-sectional views along line D.

Referring to FIGS. 2A-2D, a mask layer 500 is formed over the structures of FIGS. 1A-1D and, using conventional photolithography, patterned to define gate cut region 510 and fin cut region 520. In an example method, the mask layer 500 may include photoresist. According to further embodiments, mask layer 500 may include a photo-sensitive organic polymer that, when exposed to electromagnetic radiation, is chemically altered and thus configured to be removed using a developing solvent. For instance, a photo-sensitive organic polymer may be include a polyacrylate resin, epoxy resin, phenol resin, polyamide resin, polyimide resin, unsaturated polyester resin, polyphenylether resin, polyphenylenesulfide resin, or benzocyclobutene.

Using the patterned mask layer 500 as an etch mask, a directional etch such as a reactive ion etch (RIE) is used to remove exposed portions of the gate 410 within the gate cut region 510 to form gate cut opening 512, and to simultaneously remove exposed portions of the gate 410 and portions of the fin 120 underlying the gate 410 within the fin cut region 520 to form a fin cut opening 522. The conductive fill layer defines a majority of the sidewalls of the gate cut opening 512 and the fin cut opening 522.

In lieu of a reactive ion etch, gate cut openings and fin cut openings may be formed using alternate dry etching methods, such as plasma etching, ion beam etching or laser ablation and/or using a chemical wet etch process.

Figure 2C:
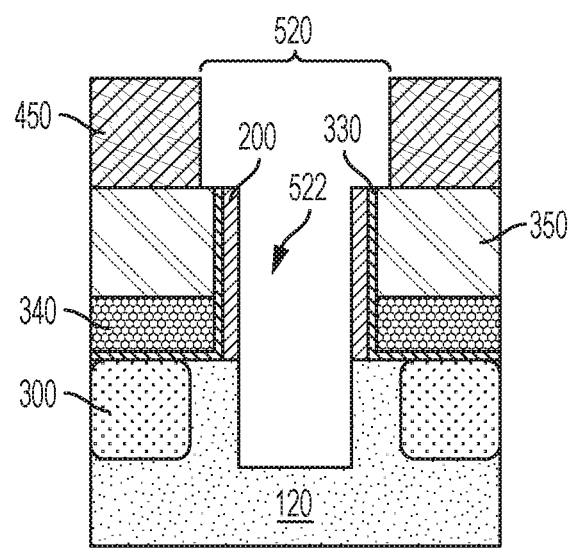
FIG. 2C depicts etching of the gate and portions of the fin underlying the gate to form an SDB opening.
Figure 2D:
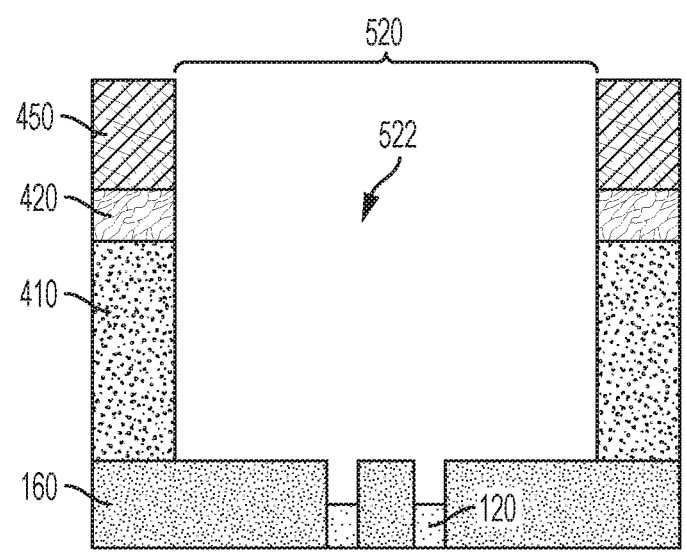
FIG. 2D shows etching of the gate and a concomitant recess etch of the fins within the single diffusion break region.
Figure 3A:
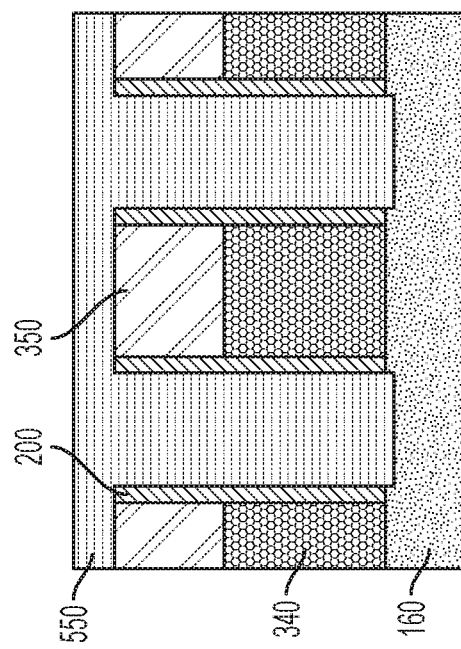
FIG. 3A depicts the deposition of a dielectric fill layer over the structure of FIG. 2A and within the gate cut opening.
Figure 3B:
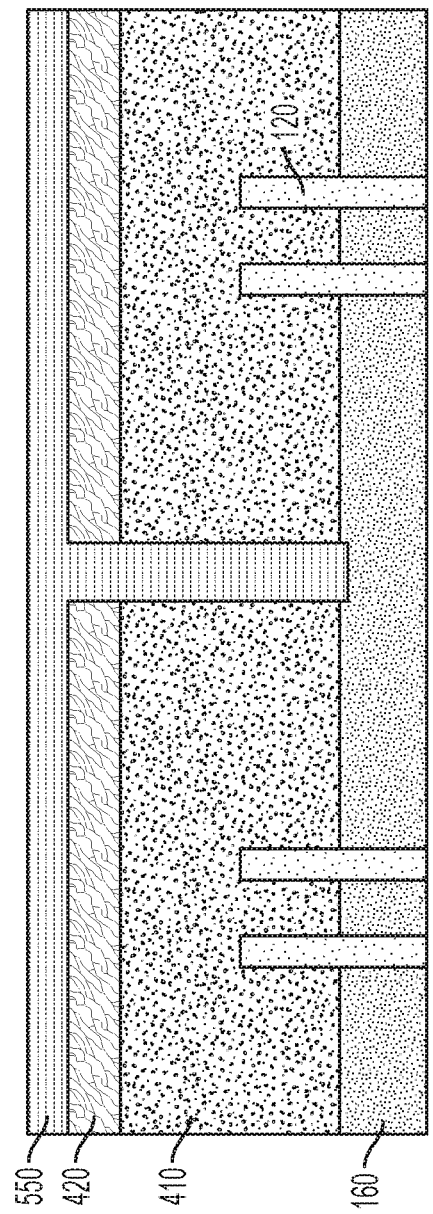
FIG. 3B depicts the deposition of the fill layer within the gate cut opening.
Figure 3C:
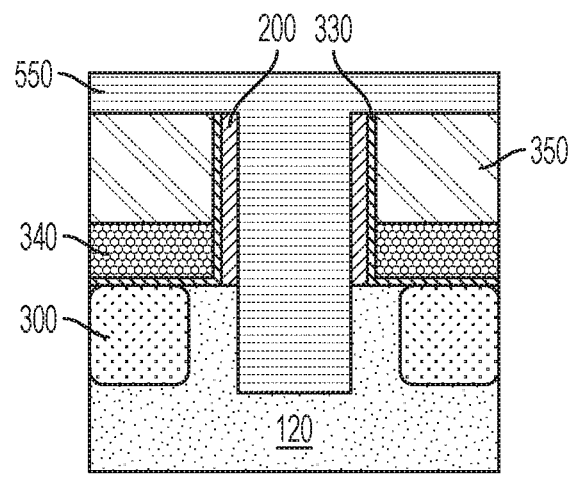
FIG. 3C shows the deposition of the fill layer over the structure of FIG. 2C and within the single diffusion break opening.
Figure 3D:
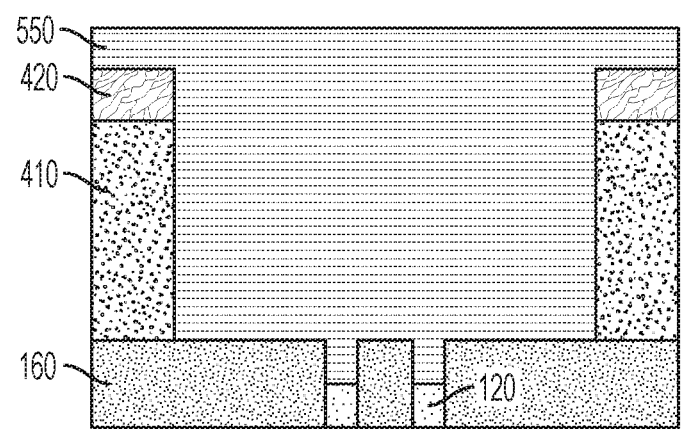
FIG. 3D shows the deposition of the dielectric fill layer within the single diffusion break opening.

In the illustrated embodiment of FIGS. 2A-2D, gate cap 420, gate 410 and fins 120 are etched selectively with respect to spacers 200, interlayer dielectric 350 and STI layer 160. STI layer 160 may form a bottom surface of the gate cut openings 512 as shown in FIGS. 2A and 2B. Referring to FIG. 2C, beneath the removed gate, fin cut opening 522 extends below a top surface of the fin 120 between adjacent spacers 200. As shown in FIG. 2D, fins 120 within the fin cut region 520 may be recessed with respect to STI 160.

Referring to FIG. 3A-3D, following removal of mask 500, the gate cut openings 512 and the fin cut openings 522 are backfilled with a sacrificial fill layer 550. According to various embodiments, the sacrificial fill layer 550 is formed from a material that is etch selective to the spacer layer 200 and the interlayer dielectric 350. In various embodiments, sacrificial fill layer 550 may include a low-k material such as amorphous carbon or an organic planarization layer (OPL). A CMP step may be used to planarize the structure.

Figure 4A:
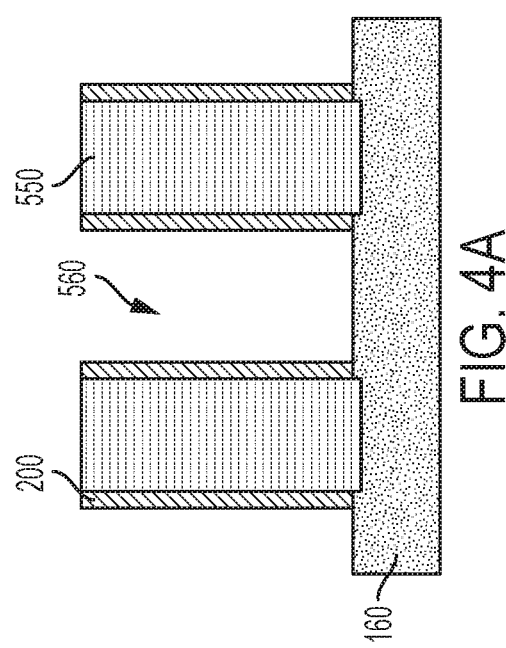
FIG. 4A shows the removal of sacrificial layers along the gate cut opening.
Figure 4B:
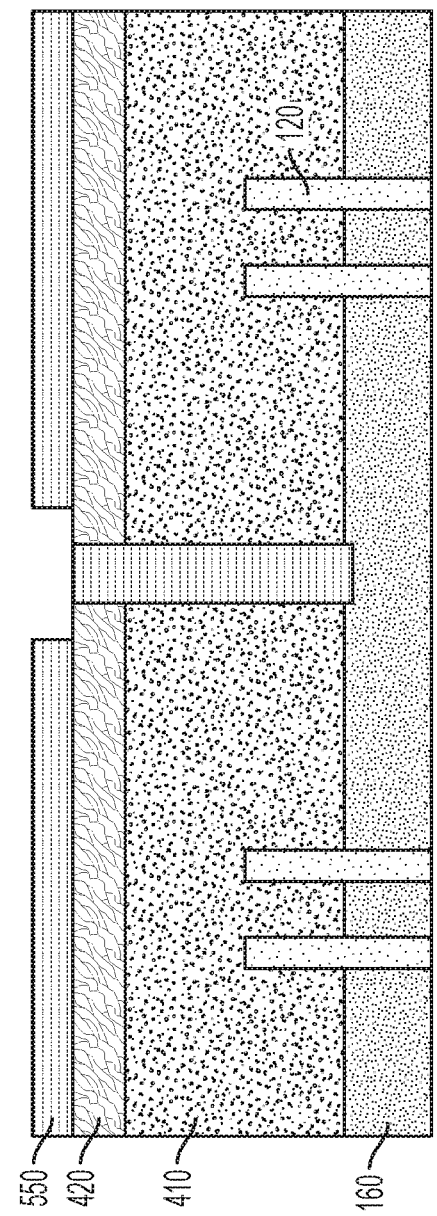
FIG. 4B depicts etching of a portion of the dielectric fill layer over shallow trench isolation between the first and second active regions.
Figure 4C:
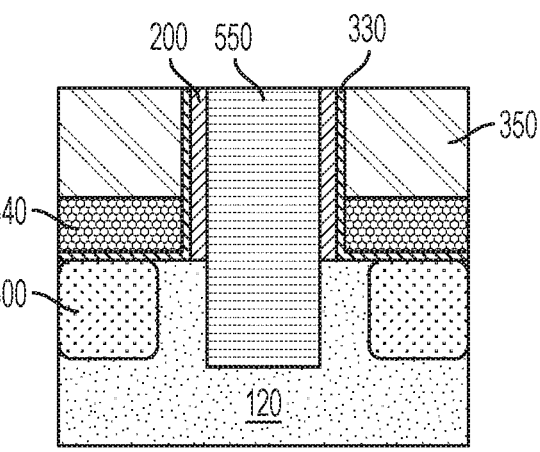
FIG. 4C shows the fill layer within the single diffusion break opening.
Figure 4D:
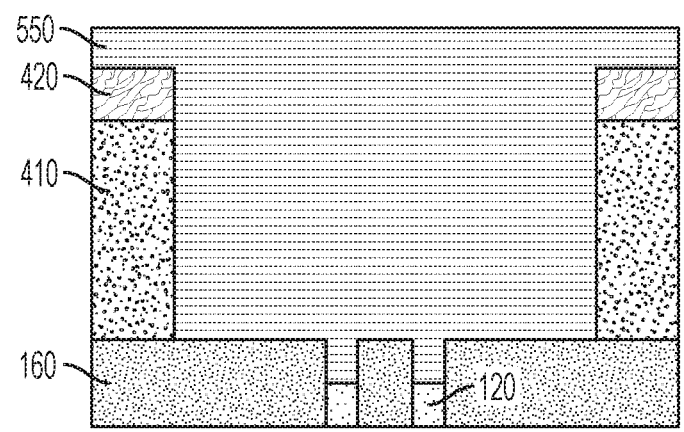
FIG. 4D shows the fill layer within the single diffusion break opening.
Figure 5A:
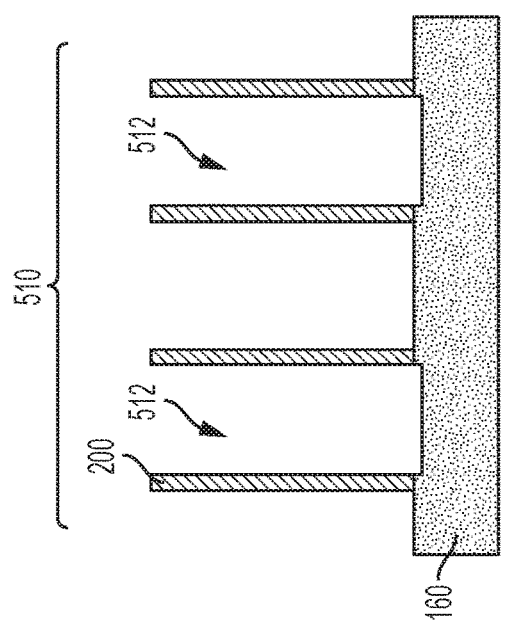
FIG. 5A depicts removal of the fill layer from within the gate cut opening.
Figure 5B:
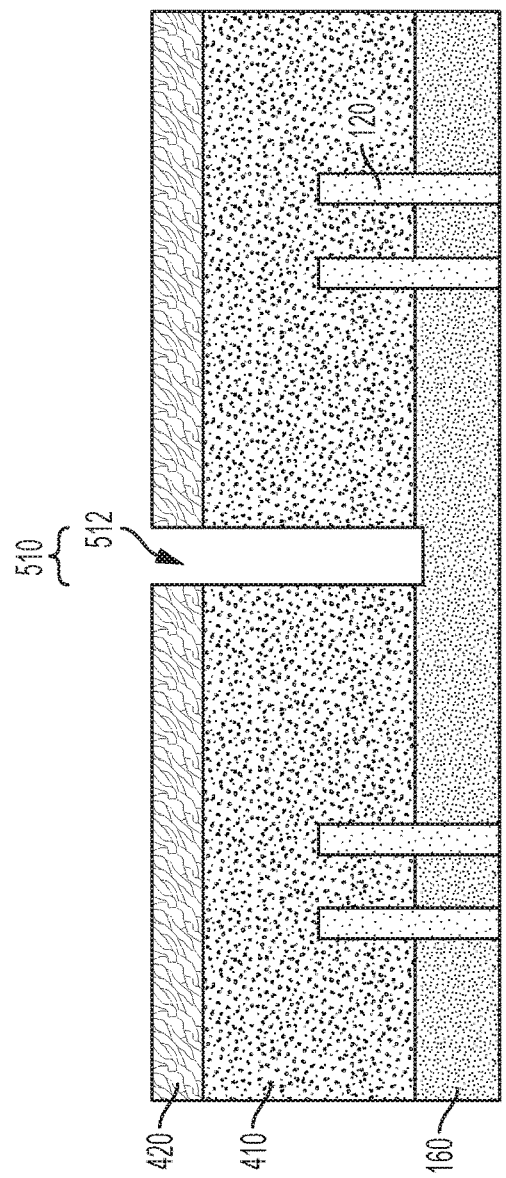
FIG. 5B shows removal of the fill layer from within the gate cut opening.
Figure 5C:
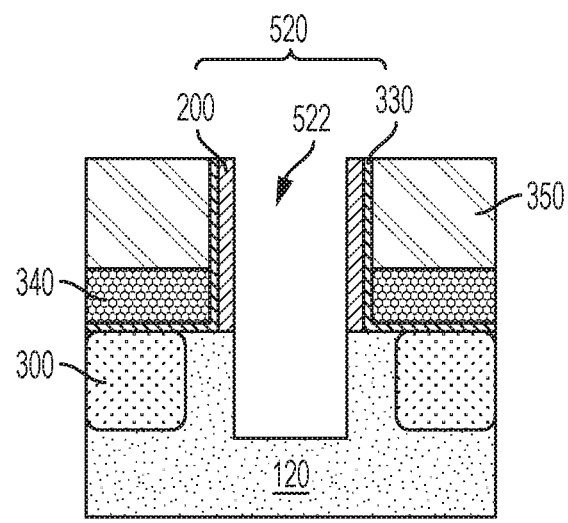
FIG. 5C shows etching of the dielectric fill layer within the single diffusion break opening.
Figure 5D:
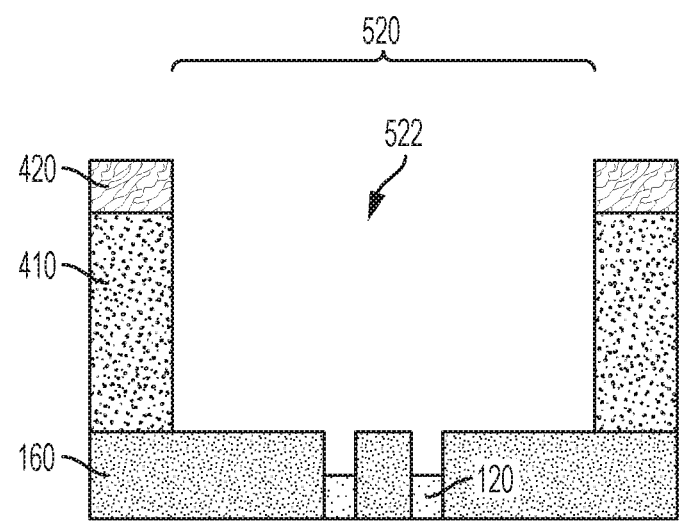
FIG. 5D depicts etching of the dielectric fill layer within the single diffusion break opening.

Referring to FIGS. 4A-4D, a block mask (not shown) is formed over first and second active regions 102A, 102B, and a subsequent etching step is used to remove the interlayer dielectric 350 and the sacrificial layer of amorphous silicon 340 from within the non-contacted regions, i.e., over STI 160 (FIG. 4A), whereas the interlayer dielectric 350 and the sacrificial layer of amorphous silicon 340 are retained within active areas of the substrate (FIG. 4C). During etching of the ILD 350 and amorphous silicon 340, sacrificial fill layer 550 is adapted to inhibit etch damage to the gate 410 (FIGS. 4B and 4D). The block mask and sacrificial fill layer 550 may then be removed, for example, by ashing, as shown in FIGS. 5A-5D. Removal of the sacrificial fill layer 550 re-opens gate cut openings 512 and fin cut openings 522.

Referring to FIG. 6 and FIGS. 6A-6D, in a single deposition step, an isolation dielectric layer 700 is formed within the gate cut opening 512, fin cut opening 522, and within trenches between adjacent gates over STI 160. In the illustrated embodiment, the isolation dielectric 700 extends continuously from sidewalls of the gate cap 420 to a top surface of the shallow trench isolation layer 160. The deposited isolation dielectric layer 700 is then polished to form a planarized structure. Isolation dielectric layer 700 may include silicon nitride, for example.

To form conductive contacts to the source/drain junctions 300, each of the ILD 350, amorphous silicon layer 340 and conformal liner 300 are removed from over source/drain regions 124 of the fins 120 to form self-aligned contact openings. Removal of the ILD, the amorphous silicon layer and the conformal liner can be performed using one or more etch steps that are selective to the adjacent, exposed layers.

For instance, ILD 350, amorphous silicon layer 340 and liner 330 can be removed by a reactive ion etch or isotropic etch such as a wet etch or an isotropic plasma etch.

A conductive contact is then formed within the contact openings and over exposed surfaces of the source/drain junctions 300 by depositing, for example, a conductive liner and a barrier layer (collectively 610) and then filling the contact openings with a conductive material 620 such as tungsten or cobalt. A CMP step may be used to planarize the structure. The conductive liner is typically titanium and the barrier layer may be titanium nitride (TiN).

Conductive contacts may include a metal that forms an ohmic contact with the source/drain junctions 300. A silicide layer (e.g., titanium silicide) may be formed in situ via reaction between the conductive liner (e.g., titanium) and the source/drain junctions 300 to form a trench silicide contact.

Figure 6:
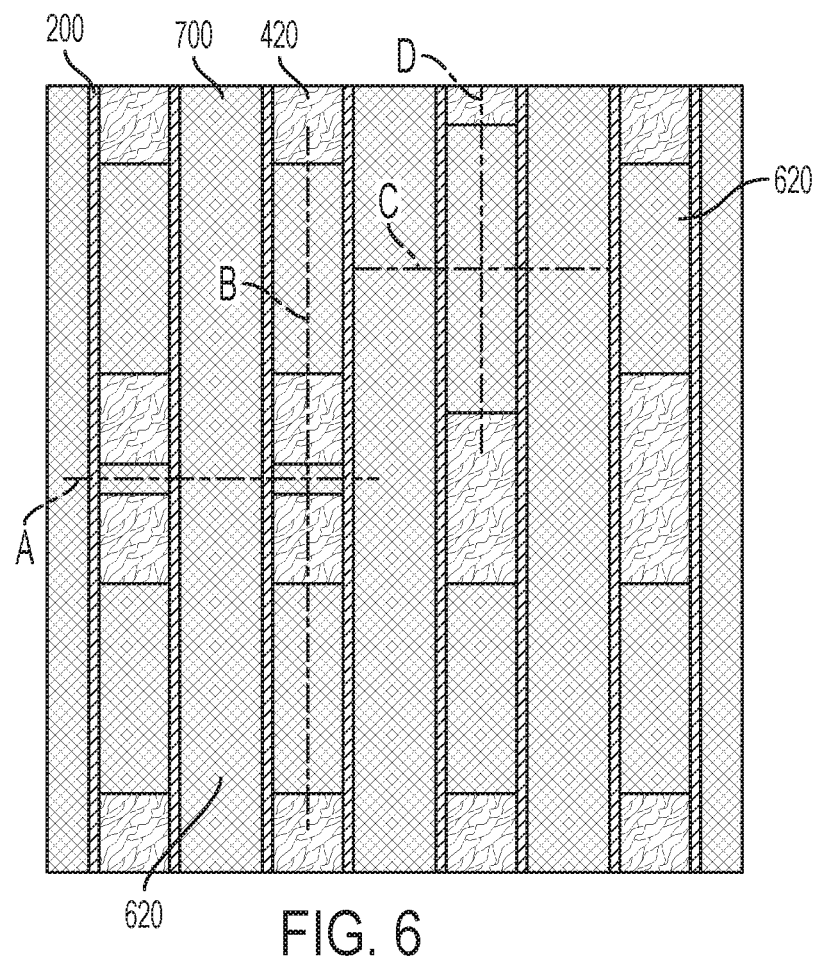
FIG. 6 shows the simultaneous formation of an isolation layer within gate cut and single diffusion break regions as well as within trenches over non-contact regions.
Figure 6A:
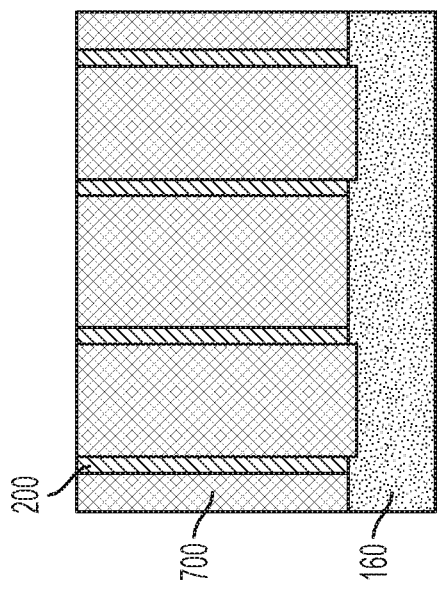
FIG. 6A depicts the deposition of the isolation layer within the gate cut opening and between neighboring gates over shallow trench isolation.
Figure 6B:
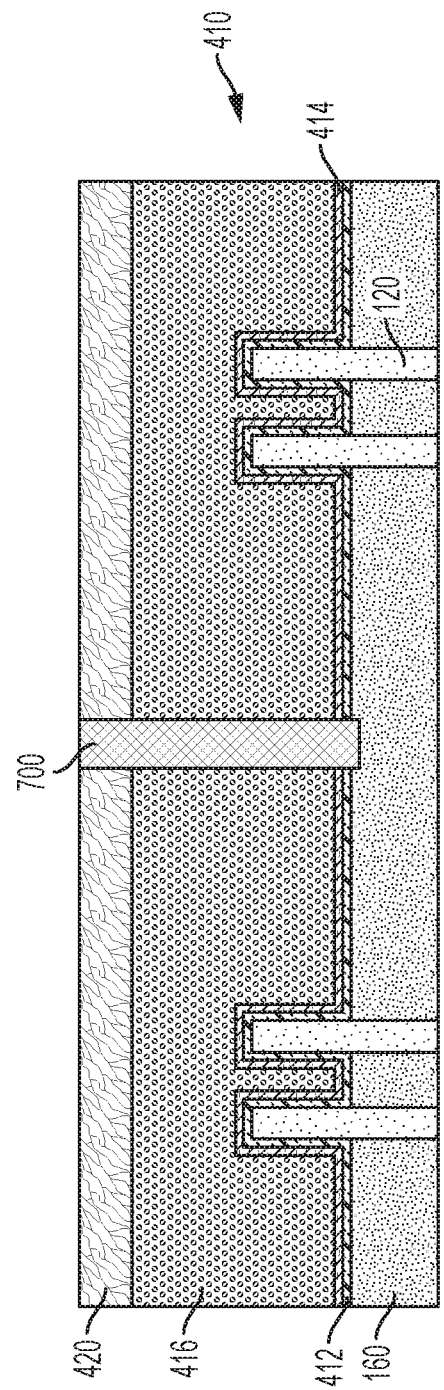
FIG. 6B shows the formation of the isolation layer within the gate cut opening.
Figure 6C:
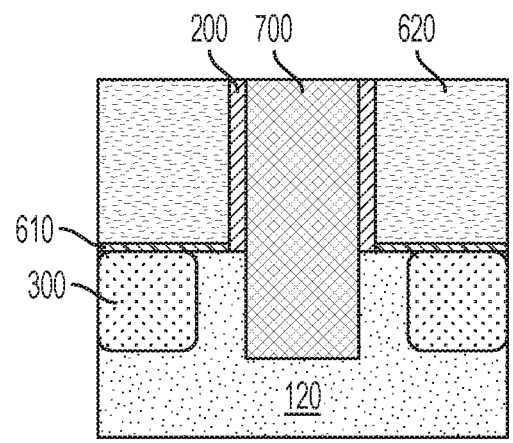
FIG. 6C depicts the formation of the isolation layer within the single diffusion break opening and the formation of contact metallization over source/drain regions of the fin.
Figure 6D:
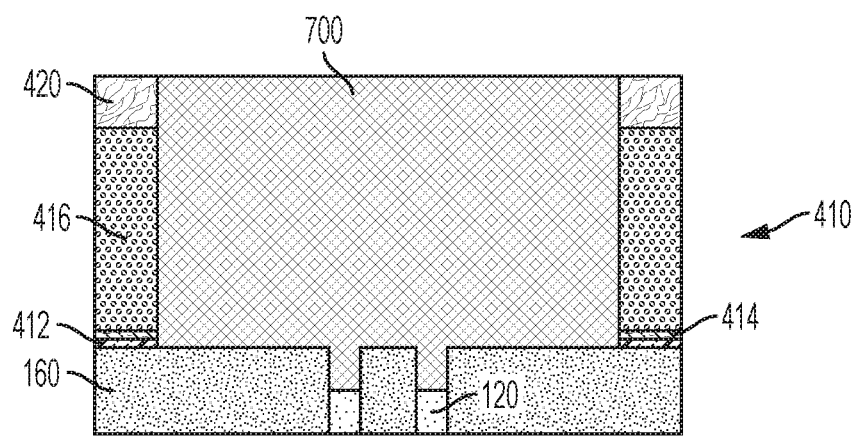
FIG. 6D shows the deposition of the isolation layer within the single diffusion break opening.

In connection with the various embodiments disclosed herein, the gate cut and fin cut openings are formed by etching a functional gate stack (rather than a sacrificial gate). The constituent layers of the gate stack 410, including the gate dielectric 412, work function metal layer 414, and the conducive fill layer 416 are shown in FIGS. 6B and 6D. As a consequence of etching and backfilling an opening in a previously formed gate 410, it will be appreciated that the isolation dielectric layer 700 is disposed directly over the conductive fill layer 416 within each of the gate cut and fin cut openings, i.e., along the lengthwise direction of each gate 410.

Furthermore, referring to FIG. 6D, in the illustrated embodiment isolation dielectric layer 700 is disposed directly over a top surface of the recessed fins 120 within the fin cut region 520. Alternately, isolation dielectric layer 700 may pinch off above the fins within the fin cut region 520 resulting in the formation of an air-gap (not shown) between the isolation dielectric and the fins 120.

Illustrated in FIGS. 1-6 is a replacement metal gate methodology for forming a FinFET. During fabrication, a single photolithography mask and corresponding etch step are used to form gate and fin cut openings. Following a patterning step to provide segmentation for source/drain conductive contacts, an isolation dielectric layer is deposited within each of the gate cut openings, fin cut openings and trenches over shallow trench isolation between device active areas.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a dielectric layer that comprises or includes silicon nitride include embodiments where a dielectric layer consists essentially of silicon nitride and embodiments where a dielectric layer consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A semiconductor device comprising:
    a plurality of semiconductor fins disposed over a semiconductor substrate, the semiconductor fins each having a source/drain region and a channel region adjacent to the source/drain region;
    a shallow trench isolation layer disposed over a top surface of the semiconductor substrate and peripheral to lower portions of the fins;
    a gate stack disposed over the channel regions, wherein the gate stack comprises a gate dielectric layer, a work function metal layer overlying the gate dielectric layer, and a conductive fill layer overlying the work function metal layer;
    a gate cap disposed over the gate stack; and
    an isolation dielectric layer extending through the gate stack, wherein the isolation dielectric layer is disposed directly over sidewalls of the conductive fill layer.

2. The semiconductor device of claim 1, wherein the isolation dielectric layer is in direct contact with a portion of the work function metal layer.

3. The semiconductor device of claim 1, wherein a top surface of at least one of the fins is disposed below a top surface of the shallow trench isolation layer and the isolation dielectric is disposed over the top surface of the at least one of the fins.

4. The semiconductor device of claim 1, wherein a top surface of at least one of the fins is disposed below a top surface of the shallow trench isolation layer and the isolation dielectric is spaced away from the top surface of the at least one of the fins.

5. The semiconductor device of claim 1, wherein the isolation dielectric extends continuously from sidewalls of the gate cap to a top surface of the shallow trench isolation layer.

6. The semiconductor device of claim 1, further comprising a conductive contact disposed over the source/drain region.

7. A semiconductor device comprising:
    a gate stack disposed over a channel region of a semiconductor layer, wherein the gate stack comprises a gate dielectric layer, a work function metal layer overlying the gate dielectric layer, and a conductive fill layer overlying the work function metal layer; and
    an isolation dielectric layer extending through the gate stack, wherein the isolation dielectric layer is disposed directly over sidewalls of the conductive fill layer.

8. The semiconductor device of claim 7, wherein the semiconductor layer comprises a semiconductor fin.

9. The semiconductor device of claim 7, wherein the isolation dielectric extends from sidewalls a gate cap overlying the gate stack to a top surface of a shallow trench isolation layer underlying the gate stack.

* * * * *